United States Patent
Gstoettenbauer et al.

(10) Patent No.: US 11,733,288 B2
(45) Date of Patent: Aug. 22, 2023

(54) CIRCUITS AND TECHNIQUES FOR ASSESSING AGING EFFECTS IN SEMICONDUCTOR CIRCUITS

(71) Applicant: Infineon Technologies AG, Neubiberg (DE)

(72) Inventors: Bernhard Gstoettenbauer, Engerwitzdorf (AT); Georg Georgakos, Erding (DE); Dirk Hammerschmidt, Villach (AT); Veit Kleeberger, Munich (DE); Ludwig Rossmeier, Dorfen (DE); Rafael Zalman, Markt Schwaben (DE); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/457,166

(22) Filed: Dec. 1, 2021

(65) Prior Publication Data

US 2023/0168293 A1 Jun. 1, 2023

(51) Int. Cl.

| | | |
|---|---|---|
| *G01R 27/08* | (2006.01) | |
| *G01R 31/26* | (2020.01) | |
| *G01R 31/28* | (2006.01) | |
| *G01R 27/02* | (2006.01) | |
| *G01R 27/14* | (2006.01) | |
| *G01L 1/20* | (2006.01) | |
| *G01L 1/22* | (2006.01) | |

(52) U.S. Cl.
CPC ......... *G01R 31/2642* (2013.01); *G01R 27/02* (2013.01); *G01R 27/08* (2013.01); *G01R 27/14* (2013.01); *G01R 31/2815* (2013.01); *G01L 1/20* (2013.01); *G01L 1/205* (2013.01); *G01L 1/2262* (2013.01)

(58) Field of Classification Search
CPC .......... G01R 31/2642; G01R 31/2815; G01R 27/02; G01R 27/14; G01R 27/08; G01L 1/205; G01L 1/20; G01L 1/2262
USPC ........... 324/76.11–76.83, 459, 600, 649, 691
See application file for complete search history.

(56) References Cited

U.S. PATENT DOCUMENTS

| | | | |
|---|---|---|---|
| 9,465,373 B2 | 10/2016 | Allen-Ware et al. | |
| 10,250,029 B2 | 4/2019 | Carletti et al. | |
| 10,699,041 B2 | 6/2020 | Hammerschmidt | |
| 2003/0023407 A1* | 1/2003 | Loehr | G05B 23/0251 |
| | | | 702/186 |
| 2006/0209607 A1 | 9/2006 | Menczigar et al. | |

(Continued)

OTHER PUBLICATIONS

"Einfluss von Alterungseffekten auf die Robustheit digitaler Schaltungen", Retrieved from https://www.edacentrum.de/robust/de/content/zue/04_zue12-robust-tutorial-TUM.pdf, Retrieved on Sep. 15, 2021, 40 pp.

(Continued)

*Primary Examiner* — Raul J Rios Russo
(74) *Attorney, Agent, or Firm* — Shumaker & Sieffert, P.A.

(57) ABSTRACT

In some examples, a method of operating a circuit may comprise performing a circuit function under normal conditions, performing the circuit function under aggravated conditions, predicting a potential future problem with the circuit function under the normal conditions based on an output of the circuit function under the aggravated conditions, and outputting a predictive alert based on predicting the potential future problem.

22 Claims, 5 Drawing Sheets

(56) References Cited

U.S. PATENT DOCUMENTS

| | | | |
|---|---|---|---|
| 2014/0068298 A1 | 3/2014 | Simeral | |
| 2014/0312873 A1 | 10/2014 | Raja et al. | |
| 2015/0081044 A1* | 3/2015 | Allen-Ware | G06F 11/008 700/28 |
| 2016/0313719 A1* | 10/2016 | Sugiyama | G05B 19/058 |
| 2017/0146591 A1* | 5/2017 | Nobbe | H03H 7/38 |
| 2020/0104167 A1* | 4/2020 | Chen | G06V 10/82 |

OTHER PUBLICATIONS

Automotive Electronics Council, "Failure Mechanism Based Stress Test Qualification for Integrated Circuits", Automotive Electronics Council, Sep. 11, 2014, 48 pp.

IEC, "Reliability data handbook—Universal model for reliability prediction of electronics components, PCBs and equipment", International Electrotechnical Commission, First edition, Received on Sep. 15, 2021, 96 pp.

Jenkins et al., "On-chip circuit to monitor long-term NBTI and PBTI degradation," Microelectronics Reliability, Elsevier, accepted Jul. 10, 2013, 5 pp.

Ritter et al., "Aging sensors for on-chip metallization of integrated LDMOS transistors under cyclic thermo-mechanical stress," Microelectronics Reliability, Elsevier, accepted Jun. 6, 2017, 5 pp.

Ritter et al., "Resistance change in on-chip aluminum interconnects under cyclic thermo-mechanical stress," Microelectronics Reliability, Elsevier, Jun. 7, 2019, 5 pp.

U.S. Appl. No. 16/915,794, filed Jun. 29, 2021, naming inventors De Gasperi et al.

U.S. Appl. No. 17/457,183, filed Dec. 1, 2021, naming inventors Zettler et al.

U.S. Appl. No. 17/457,198, filed Dec. 1, 2021, naming inventors Rossmeier et al.

U.S. Appl. No. 17/457,207, filed Dec. 1, 2021, naming inventors Hammerschmidt et al.

U.S. Appl. No. 17/457,216, filed Dec. 1, 2021, naming inventors Kleeberger et al.

U.S. Appl. No. 17/457,221, filed Dec. 1, 2021, naming inventors Georgakos et al.

* cited by examiner

CIRCUITS AND TECHNIQUES FOR ASSESSING AGING EFFECTS IN SEMICONDUCTOR CIRCUITS

TECHNICAL FIELD

This disclosure relates to semiconductor circuits, and more specifically, circuits and technique for assessing and managing semiconductor circuits during use.

BACKGROUND

Semiconductor circuits are used in a wide variety of circuit applications in order to perform any of a variety of circuit functions. Unfortunately, semiconductor circuits can degrade over time. For example, aging, environmental exposure, stress, or other conditions can lead to semiconductor degradation and possibly circuit failure, which is undesirable. The amount of stress conditions applied to semiconductor circuits strongly varies from case to case. As a result, the actual operational lifetime of a semiconductor circuit may be unpredictable.

In many situations, semiconductor circuits may be designed to tolerate a worst-case mission profile during the lifetime of a system into which circuit will be installed (e.g., a vehicle). Only a small percentage of devices will actually be exposed to the worst-case mission profile. Consequently, many semiconductor circuits are overdesigned with respect to their actual mission profile, which can increase production costs associated with the semiconductor circuits.

SUMMARY

This disclosure describes techniques and circuits for assessing aging effects in circuits and predicting future problems in circuits before they occur. The described circuits and techniques may be used with a wide variety of circuits designed for a wide variety of different circuit functions. The techniques and circuits described in this disclosure may provide predictive alerts (i.e., predictive faults) that can predict circuit problems before they actually occur in functional circuits. In this way, system maintenance can be identified and performed (e.g., to replace functional circuits within a larger system) before they exhibit actual problems or failure. The circuits and techniques may promote safety and reliability in devices or systems, such as in a vehicle or a similar setting.

In one example, this disclosure describes a circuit that comprises a circuit function unit configured to perform a circuit function, one or more input units configured to provide one or more inputs to the circuit function unit, and a monitor unit configured to monitor the circuit function unit. The one or more input units may be configured to provide a first input to the circuit function unit during a normal operation and to provide a second input that is different than the first input during a predictive safety check operation. The monitor unit may be configured to monitor the circuit function unit during the predictive safety check operation and output a predictive fault signal for the circuit in response to the predictive safety check operation identifying a problem with the circuit function unit during the predictive safety check operation.

In another example, this disclosure describes a circuit comprising a circuit function unit configured to perform a circuit function under normal conditions, a shadow circuit function unit configured to perform the circuit function under the normal conditions in a first period of time and under aggravated circuit conditions in a second period of time, and a compare unit configured to compare output of the circuit function unit under the normal conditions to output of the shadow circuit function unit under the aggravated conditions. The compare unit may be configured to output a predictive fault signal for the circuit in response to the comparison identifying a problem with the shadow circuit function unit performing the circuit function under the aggravated circuit conditions.

In another example, this disclosure describes a method of operating a circuit. The method may comprise performing a circuit function under normal conditions; performing the circuit function under aggravated conditions; predicting a potential future problem with the circuit function under the normal conditions based on an output of the circuit function under the aggravated conditions; and outputting a predictive alert based on predicting the potential future problem.

The details of one or more examples are set forth in the accompanying drawings and the description below. Other features, objects, and advantages will be apparent from the description and drawings, and from the claims.

DETAILED DESCRIPTION

This disclosure describes techniques and circuits for assessing aging effects in circuits and for predicting future problems in circuits before the problems actually occur. The described circuits and techniques may be used with a wide variety of circuits designed for a wide variety of different circuit functions. The circuits and techniques may promote safety in devices or systems, such as in a vehicle or a similar setting. Modern vehicles and other modern devices or systems may include a large number of functional circuits, and monitoring the health or operational safety of any of a wide variety of functional circuits is desirable to promote safety and reliability vehicles or other devices or systems.

The techniques and circuits described in this disclosure may provide predictive alerts that can predict circuit problems before they actually occur in a functional circuit that that is configured to perform a circuit function. In this way, system maintenance can be identified and performed (e.g., to replace a circuit in the system) before the circuit exhibits actual problems or failure. In some cases, the techniques and circuits of this disclosure for predicting future problems in a circuit may be used in combination with other techniques that identify actual circuit problems that may currently exist. Accordingly, the techniques of this disclosure may generate system alerts in response to identifying actual existing problems with a functional circuit, and the techniques of this disclosure may also generate predictive system alerts to predict future problems with the functional circuit (e.g., to prompt anticipatory maintenance on the system).

Figure 1:
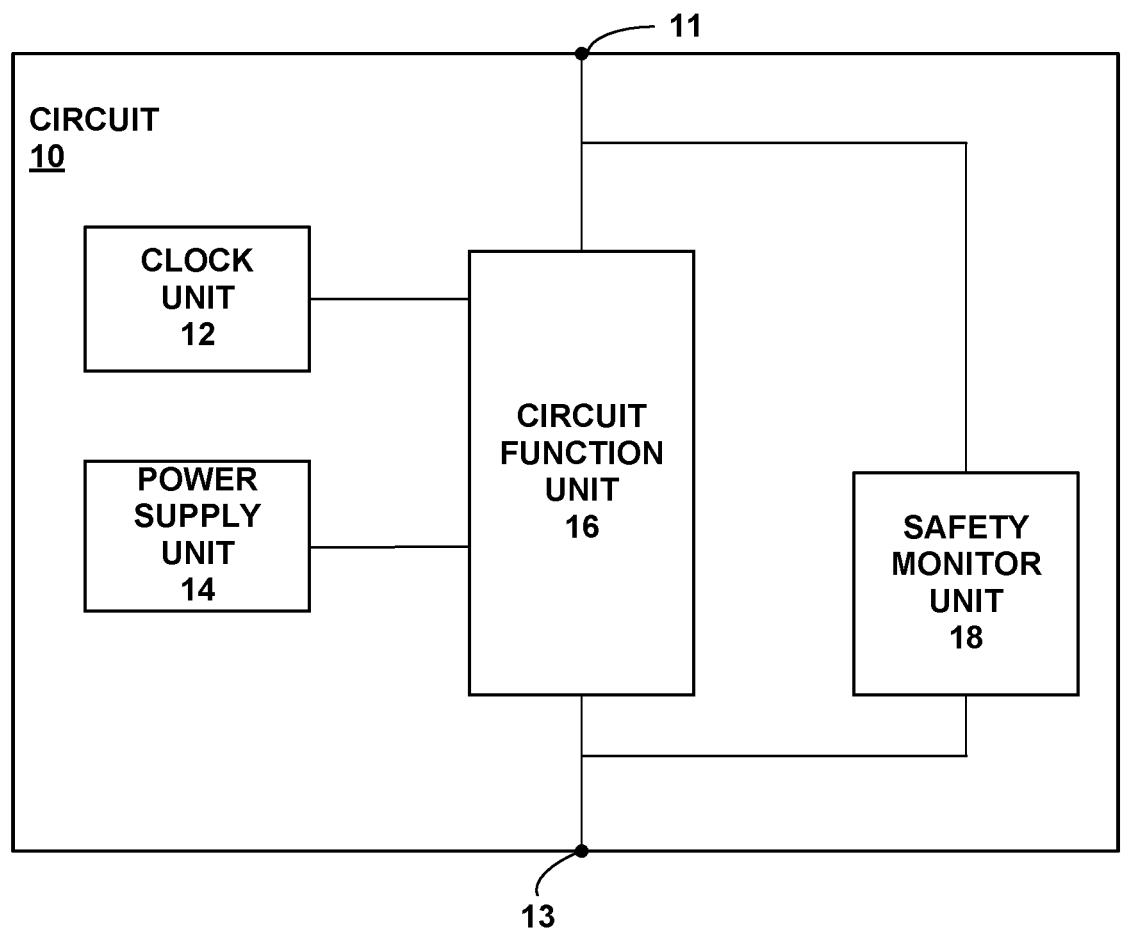
FIG. 1 is a block diagram showing a circuit according to an example of this disclosure.

FIG. 1 is a block diagram showing a circuit 10 according to an example of this disclosure. Circuit 10 comprises a circuit function unit 16 configured to perform a circuit function. Circuit 10 may include an input pin 11 that delivers one or more input signals from another circuit or device to circuit function unit 16, and an output pin 13 for delivering the output of circuit function unit 16 to another circuit or device.

Circuit function unit 16 may be configured to perform one or more circuit functions. For example, circuit function unit 16 may comprise a driver circuit configured to drive a load. In another example, circuit function unit 16 may comprise a logic circuit configured to perform one or more logic functions. In another example, circuit function unit 16 may comprise a motor driver configured to drive a motor such as a multi-phase motor. In another example, circuit function unit 16 may comprise an oscillator circuit configured to generate an oscillating signal. In another example, circuit function unit 16 may comprise a level shifter circuit configured to shift or change the voltage level of a signal. In another example, circuit function unit 16 may comprise a phase shift circuit configured to shift the phase of a signal. In another example, circuit function unit 16 may comprise a phase locked loop circuit configured to provide an output signal having a phase that is based on the input signal. In another example, circuit function unit 16 may comprise an analog-to-digital converter (ADC) circuit configured to convert an analog signal to a digital signal. In another example, circuit function unit 16 may comprise a digital-to-analog converter (DAC) circuit configured to convert a digital signal to an analog signal. In another example, circuit function unit 16 may comprise an arithmetic logic unit (ALU) configured to perform an arithmetic function. In still other examples, circuit function unit 16 may comprise a processor, a microcontroller, a digital signal processor (DSP), a communication interface circuit such as a serial peripheral interface (SPI) or another type of communication interface circuit, a digital logic circuit, a state machine, a signal processing circuit, a control circuit, an analog function circuit, a memory circuit, a sensor, a sensor combined with at least a part of its readout and signal processing circuit, a communication interface or any other circuit configured to perform one or more circuit functions.

Circuit 10 includes one or more input units configured to provide one or more inputs to the circuit function unit 16. For example, input units of circuit 10 may include a clock unit 12 and/or a power supply unit 14. Clock unit 12 may comprise a clock or a circuit element configured to deliver a clock signal to circuit function unit 16. Power supply unit 14 may comprise a power supply (such as a battery) or a circuit element configured to deliver a power supply to circuit function unit 16. As described in greater detail below, in some examples, clock unit 12 and power supply unit 14 may be configured to define aggravated circuit conditions, such as an increased clock speed relative to a normal clock speed or a reduced power supply relative to a normal power supply, as part of a predictive safety check operation performed in circuit 10.

Circuit 10 included a safety monitor unit 18 configured to monitor circuit function unit 16. Safety monitor unit 18 may be configured to monitor circuit function unit 16 during a predictive safety check operation and output a predictive fault signal for circuit 10 in response to the predictive safety check operation identifying a problem with circuit function unit 16 during the predictive safety check operation. Safety monitor unit 18 may identify a problem, for example, by comparing output of circuit function unit 16 under the aggravated circuit conditions relative to output of circuit function unit 16 under the normal circuit conditions, or by comparing output of circuit function unit 16 under the aggravated circuit conditions to a defined threshold.

The one or more input units (e.g., clock unit 12 and/or power supply unit 14) may be configured to provide a first input to circuit function unit 16 during a normal operation and to provide a second input to circuit function unit 16 during a predictive safety check operation, wherein the first input is different than the second input. For example, the first input may comprise a normal power supply level and the second input may comprise a reduced power supply level. Alternatively or additionally, the first input may comprise a normal clock speed and the second input may comprise an increased clock speed. In some examples, the first input comprises a normal power supply level and a normal clock speed, and the second input comprises a reduced power supply level and an increased clock speed.

By creating aggravated conditions for circuit function unit 16 and testing operation of circuit function unit 16 under such aggravated conditions during a safety check operation, circuit 10 may be capable of estimating or predicting future problems or failure by circuit function unit 16. Circuit function unit 16 may exhibit problems under the aggravated conditions that are not necessarily present in the normal operating conditions, but such problems under the aggravated conditions may help predict future problems or failure in the normal conditions before such problems occur. Therefore, upon estimating or predicting future problems or failure by circuit function unit 16, safety monitor unit 18 may generate one or more predictive faults for circuit 10, which may prompt a larger system for maintenance or replacement of circuit 10. Problems with circuit 10 to trigger a predictive fault, for example, may include operational parameters for circuit function unit 16 that are outside of specification or outside of a defined guard band for one or more operational parameters, when operating under the aggravated conditions.

Figure 2:
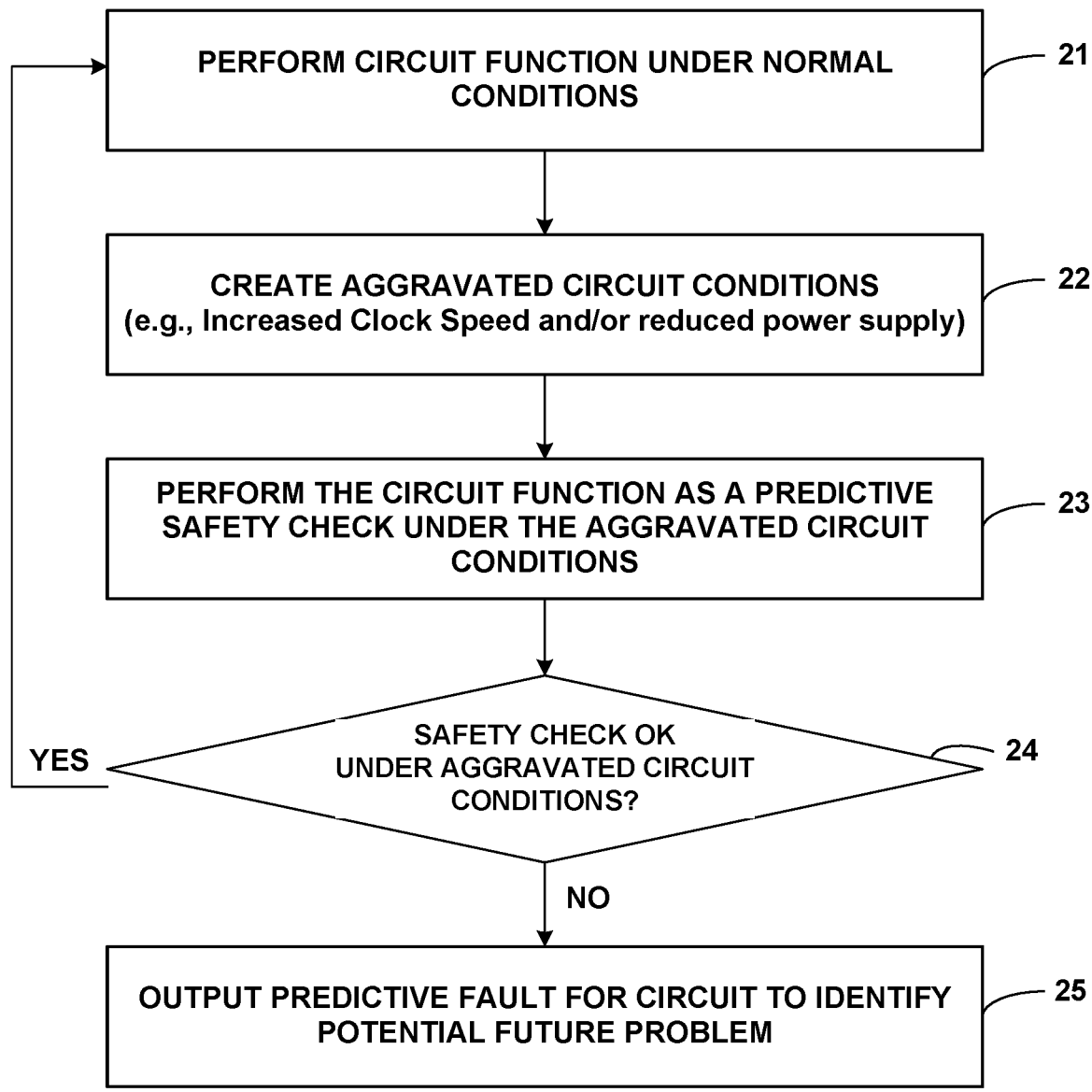
FIG. 2 is a flow diagram showing operation of a circuit according to an example of this disclosure.

FIG. 2 is a flow diagram showing operation of a circuit 10 according to an example of this disclosure. As shown in FIG. 2, in operation of circuit 10, circuit function unit 16 may perform a circuit function under normal conditions (21). Normal conditions, for example, may comprise a normal clock speed, a normal power supply level, or a combination of a normal clock speed and a normal power supply level. Clock unit 12 and/or power supply unit 14 may deliver inputs to circuit function unit 16, and may create aggravated conditions, such as an increased clock speed relative to a normal clock speed and/or a reduced power supply level relative to a normal power supply level (22). Circuit function unit 16 may then perform the circuit function under the aggravated conditions (23).

According to this disclosure, safety monitor unit 18 may be configured to predict a potential future problem with a circuit function performed by circuit function unit 16 under the normal conditions based on an output of circuit function unit 16 under the aggravated conditions. For example, as shown in FIG. 2, safety monitor unit 18 may be configured to determine whether a safety check on circuit function unit 16 is OK under the aggravated conditions (24). If not (no branch of 24), then safety monitor unit 18 may output a predictive fault to an external processor, microcontroller, or other system level device, based on predicting the potential future problem of circuit function unit. The fault may be predictive insofar as no problems may exist with circuit function unit 16 operating in the normal conditions. Rather, when problems manifest with circuit function unit 16 under the aggravated conditions, this may be a harbinger of future problems manifesting under normal conditions. Therefore, upon identifying one or more problems with circuit function unit 16 under the aggravated conditions, this can be used to trigger maintenance for circuit 10 before problems manifest in circuit function unit 16 under normal conditions.

In some examples, performing the circuit function under the normal conditions (21) comprises receiving a normal power supply level and performing the circuit function under the aggravated conditions (23) comprises receiving a reduced power supply level. In some examples, performing the circuit function under the normal conditions (21) comprises receiving a normal clock signal and performing the circuit function under the aggravated conditions (23) comprises receiving an increased clock signal. In some examples, performing the circuit function under the normal conditions (21) comprises receiving a normal power supply level and a normal clock speed and performing the circuit function under the aggravated conditions (23) comprises receiving a reduced power supply level and an increased clock signal.

In this disclosure, an increased clock signal may refer to an increased clock speed or an increased clock frequency relative to a normal clock speed or frequency. Also, in some examples, aggravated conditions may comprise an increased voltage ripple on a supply signal or an increased noise level on a supply signal. In some examples an increased voltage ripple on a supply signal or an increased noise level on the supply signal could be provided as an aggravated condition within a normal supply level or within a reduced supply level. Moreover, in some examples, an aggravated conditions for a clock signal may comprise an asynchronous delay of low-high vs. high-low (i.e., a duty cycle that deviates from a 50% duty cycle). In this case, the frequency of an aggravated clock signal may be similar to a frequency of a normal clock signal, but the duty cycle of the aggravated clock signal may be different than the duty cycle of the normal clock signal.

In some examples, circuit 10 is configured to perform the predictive safety check operation during a start-up process associated with circuit 10. Within automobiles, for example, circuits may start operation when the vehicle is turned on or when specific vehicle functions are enabled. In some cases, the process of FIG. 2 may be performed when circuit 10 is started or enabled.

In other examples, circuit 10 may be configured to perform the predictive safety check operation periodically during the normal operation of circuit 10 within a larger system. The safety check operation using aggravated conditions may be performed periodically, e.g., weekly, daily, hourly, every 10 minutes, or at any desirable testing interval.

In order to achieve an integrated circuit with integrated safety monitoring features according to this disclosure, in some examples, circuit 10 of FIG. 1 may be housed within a molding compound. In other words, circuit function unit 16, safety monitor unit 18, clock unit 12 and power supply unit 14 may all reside within a molding compound of a circuit package. Alternatively, in some examples, circuit function unit 16 and safety monitor unit 18 may reside in a circuit package, and clock unit 12 and power supply unit 14 may comprise input units to the circuit package. Moreover, in other examples, one or more of circuit function unit 16, safety monitor unit 18, clock unit 12 or power supply unit 14 may comprise separate circuit packages that collectively form circuit 10. Again, however, by implementing circuit function unit 16, safety monitor unit 18, clock unit 12 and power supply unit 14 all within a molding compound of a circuit package, a self-contained functional circuit with integrated safety monitoring functionality can be achieved.

Figure 3:
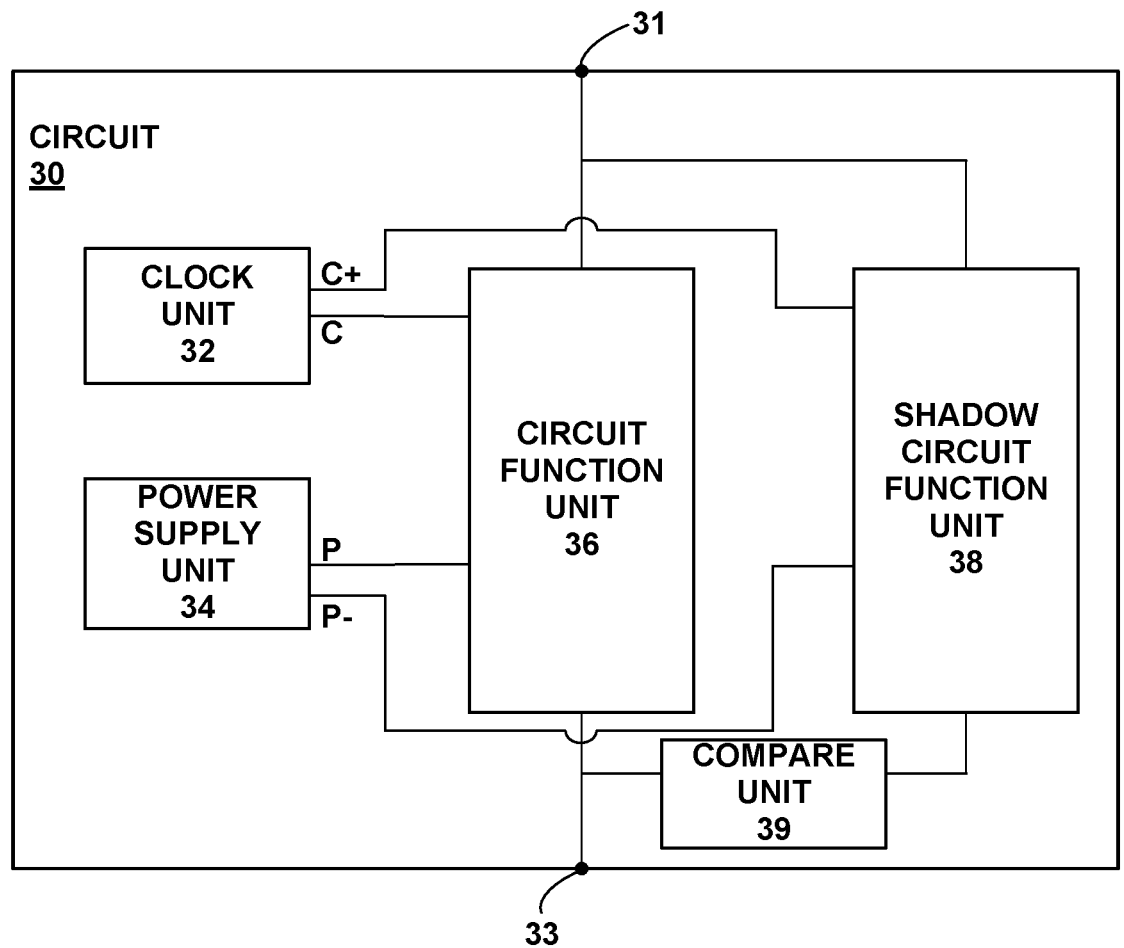
FIG. 3 is another block diagram showing a circuit according to an example of this disclosure.

FIG. 3 is another block diagram showing a circuit 30 according to an example of this disclosure. Circuit 30 may perform similar operations as circuit 10 described above. However, circuit 30 may include both a circuit function unit 36 and a shadow circuit function unit 38. Shadow circuit function unit 38 may perform a shadow circuit function (e.g., a similar or duplicative circuit function) to that performed by circuit function unit 36. Since aggravated conditions may themselves cause undesirable stress to circuit function unit 36, in the example of FIG. 3, the aggravated conditions are not applied to circuit function unit 36 and are instead applied to shadow circuit function unit 38. A compare unit 39 may be configured to compare operation of circuit function unit 36 under normal conditions to operation of shadow circuit function unit 38 under aggravated conditions in order to identify problems in shadow circuit function unit 38 under the aggravated conditions that may predict potential future problems in circuit function unit 36. Moreover, as described in greater detail below, in some examples, circuit 30 may be configured to perform actual fault testing of circuit 10 by comparing output of circuit function unit 36 and shadow circuit function unit 38 under normal operating conditions, in addition to performing predictive analysis on circuit function unit 36 in normal operating conditions relative to shadow circuit function unit 38 under aggravated operating conditions.

Circuit 30 comprises a circuit function unit 36 configured to perform a circuit function, and a shadow circuit function unit 38 configured to perform a similar or identical function to that performed by circuit function unit 36. Circuit 30 may include an input pin 31 that delivers one or more input signals from another circuit or device to circuit function unit 36 and shadow circuit function unit 38, and an output pin 33 for delivering the output of circuit function unit 36 to another circuit or device.

Circuit function unit 36 and shadow circuit function unit 38 of FIG. 3 may each be configured to perform one or more similar or identical circuit functions. Like circuit function unit 16 in FIG. 1, circuit function unit 36 and shadow circuit function unit 38 of FIG. 3 may comprise a driver circuit, a logic circuit, a motor driver, an oscillator circuit, a level shifter circuit, a phase shift circuit, a phase locked loop circuit, an ADC circuit, a DAC circuit, an ALU, a processor, a microcontroller, a DSP, a communication interface circuit such as an SPI or another type of communication interface circuit, a digital logic circuit, a state machine, a signal processing circuit, a control circuit, an analog function circuit, a memory circuit, or any other circuit configured to perform one or more circuit functions.

Circuit 30 includes one or more input units configured to provide one or more inputs to the circuit function unit 36 and shadow circuit function unit 38. For example, input units of circuit 30 may include a clock unit 32 and/or a power supply unit 34. Clock unit 32 may comprise a clock or a circuit element configured to deliver a clock signal to circuit function unit 36 and shadow circuit function unit 38. Power supply unit 34 may comprise a power supply (such as a battery) or a circuit element configured to deliver a power supply to circuit function unit 36 and shadow circuit function unit 38. In some examples, clock unit 32 and power supply unit 34 may be configured to define aggravated circuit conditions, such as an increased clock signal (C+) (e.g., an increased clock speed or increased clock frequency) relative to a normal clock signal (C) and/or a reduced power supply (P−) relative to a normal power supply (P), as part of a predictive safety check operation performed in circuit 30.

As shown in FIG. 3, circuit 30 includes a compare unit 39, which may comprise one or more comparators configured to compare output of the circuit function unit 36 under the normal conditions to output of the shadow circuit function unit 38 under the aggravated conditions. Moreover, compare unit 39 may be configured to output a predictive fault signal for circuit 30 in response to the comparison identifying a problem with the shadow circuit function unit 38 performing the circuit function under the aggravated circuit conditions.

Again, in some examples, the normal circuit conditions may comprise receiving a normal power supply level (P) and the aggravated circuit conditions comprise receiving a reduced power supply level (P−). In some examples, the normal circuit conditions comprise receiving a normal clock signal (C) and the aggravated circuit conditions comprise receiving an increased clock signal (C+), which may comprise an increased clock frequency or increased clock speed relative to a clock frequency associated with normal clock signal (C). In some examples, the normal circuit conditions comprise receiving a normal power supply level (P) and a normal clock signal (C), and the aggravated circuit conditions comprise receiving a reduced power supply level and an increased clock signal.

Again, in this disclosure, an increased clock signal may refer to an increased clock speed or an increase in clock frequency. Also, in some examples, aggravated conditions may comprise an increased voltage ripple on a supply signal or an increased noise level on a supply signal. In some examples an increased voltage ripple on a supply signal or an increased noise level on the supply signal could be provided as an aggravated condition within a normal supply level or within a reduced supply level. Moreover, in some examples, an aggravated condition for a clock signal may comprise an asynchronous delay of low high vs. high/low (a duty cycle that deviates from a 50% duty cycle). In this case, the frequency of an aggravated clock signal may be similar to a frequency of a normal clock signal, but the duty cycle of the aggravated clock signal may be different than the duty cycle of the normal clock signal.

The process of comparing output of circuit function unit 36 under normal conditions to the output of shadow circuit function unit 38 under aggravated conditions may be referred to as a predictive safety check operation. In some examples, circuit 30 is configured to perform the predictive safety check operation during a start-up process associated with circuit 30. Within automobiles, for example, circuits may start operation when the vehicle is turned on or when specific vehicle functions are enabled. In some cases, the process of FIG. 2 may be performed when circuit 10 is started or enabled. In other examples, circuit 30 may be configured to perform the predictive safety check operation periodically during the normal operation of circuit 30 within a larger system. The safety check operation using aggravated conditions may be performed periodically, e.g., weekly, daily, hourly, every 10 minutes, or at any desirable testing interval.

In some cases, in addition to the predictive safety check operation, circuit 30 may be configured to perform actual fault monitoring of circuit function unit 36. To do so, compare unit 39 may be further configured to compare output of the circuit function unit 36 under the normal conditions to output of the shadow circuit function unit 38 under the normal conditions. In this case, compare unit 39 may be configured to output an actual fault signal for circuit 30 in response to the comparison of output of the circuit function unit 36 under the normal conditions to output of the shadow circuit function unit 38 under the normal conditions identifying a circuit problem. Thus, compare unit 39 may be configured to compare output of the circuit function unit 36 under the normal conditions to output of the shadow circuit function unit 38 under the normal conditions for actual fault monitoring, and compare unit 39 may be further configured to compare output of the circuit function unit 36 under the normal conditions to output of the shadow circuit function unit 38 under the aggravated conditions for predictive fault monitoring. In addition to the actual fault monitoring, the act of delivering normal power supply and normal clock speed to shadow circuit function unit 38 during normal operation may help to improve the safety check operation (under aggravated conditions) because the act of delivering normal power supply and normal clock speed to shadow circuit function unit 38 during normal operation may cause shadow circuit function unit 38 to degrade similarly over time to circuit function unit 36, which generally operates at the normal power supply and normal clock speed.

In some examples, it may be desirable to also apply aggravated conditions circuit function unit 36, or possibly to apply aggravated conditions to circuit function unit 36 and shadow circuit function unit 38 at different times. For example, circuit 30 may be configured to swap the function of circuit function unit 36 and shadow circuit function unit 38 (e.g., periodically), in order to increase the likelihood detecting faults under aggravated conditions.

In order to achieve an integrated circuit with integrated safety monitoring features according to this disclosure, in some examples, circuit 30 of FIG. 1 may be housed within a molding compound. In other words, circuit function unit 36, safety monitor unit 38, clock unit 32, power supply unit 34, and compare unit 39 may all reside within a molding compound of a circuit package. Alternatively, in some examples, circuit function unit 36 and safety monitor unit 38 may reside in a circuit package with compare unit 39, and clock unit 32 and power supply unit 34 may comprise input units to the circuit package. Moreover, in other examples, one or more of circuit function unit 36, safety monitor unit 38, compare unit 39, clock unit 32 or power supply unit 34 may comprise separate circuit packages that collectively form circuit 30. Again, however, by implementing circuit function unit 36, safety monitor unit 38, compare unit 39, clock unit 32 and power supply unit 34 all within a molding compound of a circuit package, a self-contained functional circuit with integrated safety monitoring functionality can be achieved.

Figure 4:
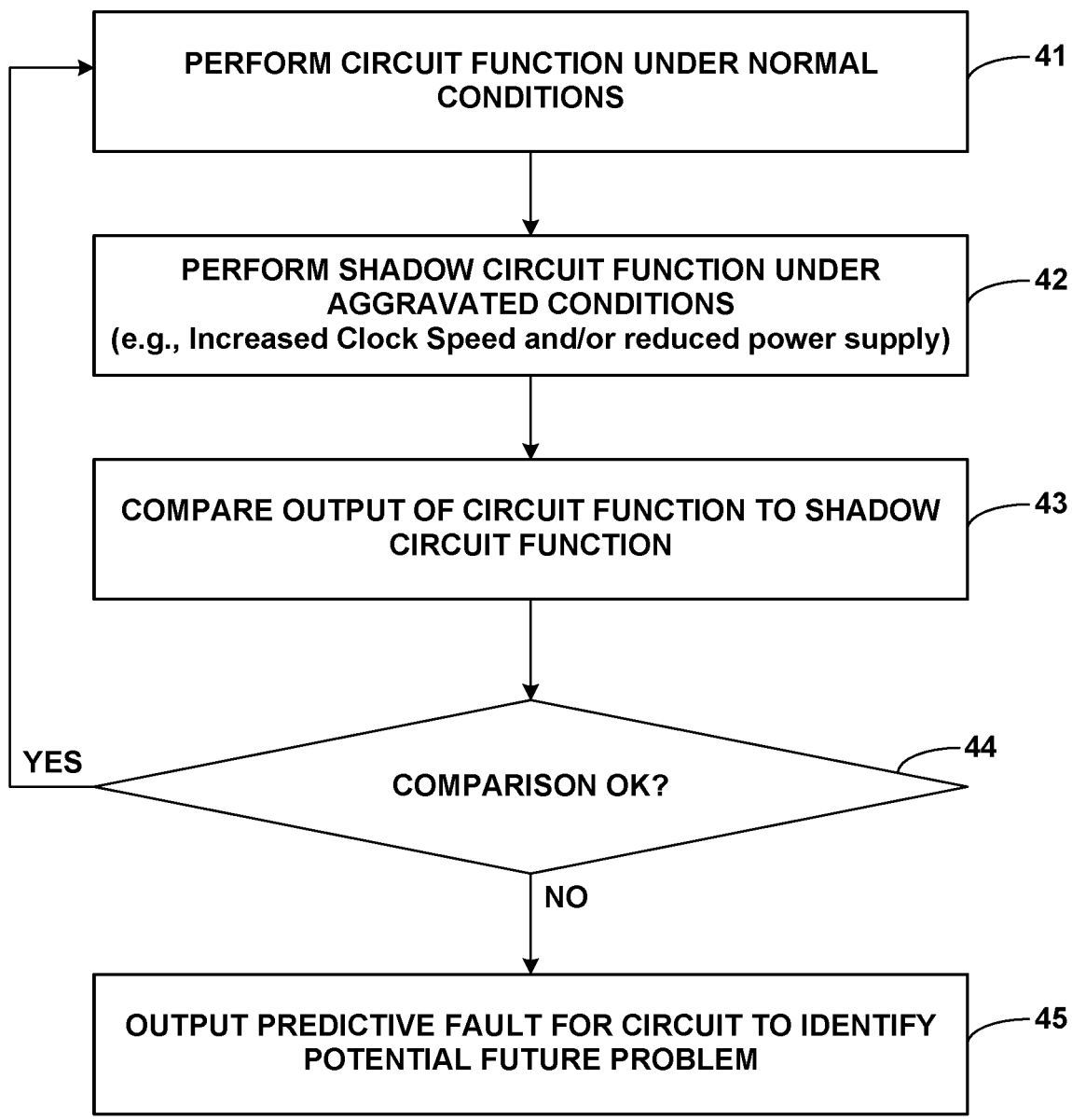
FIG. 4 is a flow diagram showing operation of a circuit according to an example of this disclosure.

FIG. 4 is a flow diagram showing operation of a circuit 30 according to an example of this disclosure. As shown in FIG. 4, in operation of circuit 30, circuit function unit 36 may perform a circuit function under normal conditions (41). Normal conditions, for example, may comprise a normal clock signal (C) (e.g., a normal clock frequency or a normal clock speed), a normal power supply level (P), or a combination of a normal clock signal (C) and a normal power supply level (P). Clock unit 32 and/or power supply unit 34 may deliver inputs to circuit function unit 36.

Shadow circuit function unit 38 may perform the same circuit function as circuit function unit 36, but shadow circuit function unit 38 may perform such circuit functions under aggravated conditions (42). Aggravated conditions, for example, may comprise an increased clock signal (C+), a reduced power supply level (P−), or a combination of a increased clock signal (C+) and a reduced power supply level (P−). Clock unit 32 and/or power supply unit 34 may deliver such inputs to shadow circuit function unit 38.

Compare unit 39 may be configured to predict a potential future problem with a circuit function performed by circuit function unit 36 under the normal conditions based on comparing output of circuit function unit 36 under the normal conditions to output of shadow circuit function unit 38 under aggravated conditions. In particular, as shown in FIG. 4, compare unit 39 is configured to compare output of output of circuit function unit 36 under the normal conditions to output of shadow circuit function unit 38 under aggravated conditions (43). Based on the comparison (no branch of 44), compare unit 39 may be configured to may output a predictive fault (45) to an external processor, microcontroller, or other system level device, based on predicting the potential future problem of circuit function unit 36. The fault may be predictive insofar as no problems may exist with circuit function unit 36 operating in the normal conditions. Rather, when problems manifest with shadow circuit function unit 38 under the aggravated conditions relative to circuit function unit 36 under normal conditions, this may be a harbinger of future problems manifesting in circuit function unit 36 under the normal conditions. Therefore, upon identifying one or more problems or differences with shadow circuit function unit 38 under the aggravated conditions relative to circuit function unit 36 under the normal conditions, this can be used to trigger maintenance for circuit 30 before problems manifest in circuit function unit 36 under normal conditions.

Figure 5:
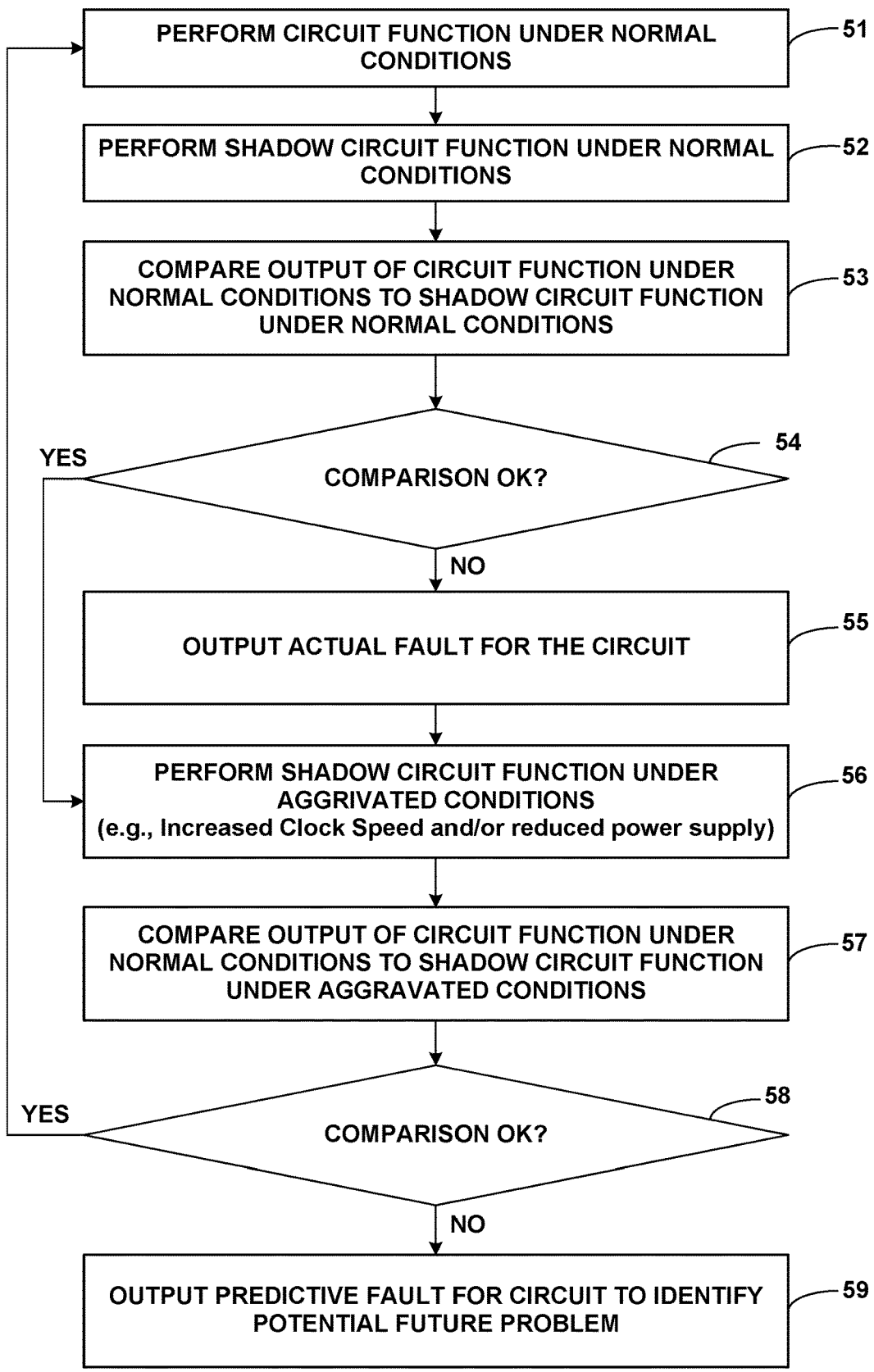
FIG. 5 is another flow diagram showing operation of a circuit according to an example of this disclosure.

FIG. 5 is another flow diagram showing operation of a circuit 30 according to an example of this disclosure. In the example shown in FIG. 5, circuit 30 may be configured to perform both actual fault monitoring of circuit function unit 36 and predictive fault monitoring of circuit function unit 36.

As shown in FIG. 5, in operation of circuit 30, circuit function unit 36 may perform a circuit function under normal conditions (51), and shadow circuit function unit 38 may also perform a similar or identical circuit function under the normal conditions (52). Normal conditions, for example, may comprise a normal clock signal (C) (e.g., a normal clock speed or a normal clock frequency), a normal power supply level (P), or a combination of a normal clock signal (C) and a normal power supply level (P). Clock unit 32 and/or power supply unit 34 may deliver inputs to circuit function unit 36 and shadow circuit function unit 38 for such normal operation.

In the example shown in FIG. 5, compare unit 39 may be configured to identify whether a fault exists for a circuit function performed by circuit function unit 36 under the normal conditions based on comparing output of circuit function unit 36 under the normal conditions to output of shadow circuit function unit 38 under the normal conditions. In particular, as shown in FIG. 5, compare unit 39 is configured to compare output of circuit function unit 36 under the normal conditions to output of shadow circuit function unit 38 under the normal conditions (53). Based on the comparison (no branch of 54), compare unit 39 may be configured to output an actual fault (55) to an external processor, microcontroller, or other system level device, based on identifying an actual problem of circuit function unit 36. The actual fault may indicate that circuit function unit 36 is operating differently than shadow circuit function unit 38, which may indicate a problem that needs maintenance in circuit 30.

In addition to the actual fault monitoring of circuit 30 in steps 53-55 of FIG. 5, the process of FIG. 5 may further include predictive fault monitoring. For predictive fault monitoring, as shown in FIG. 5, in operation of circuit 30, circuit function unit 36 may perform a circuit function under normal conditions (51), and shadow circuit function unit 38 may perform the same circuit function as circuit function unit 36, but shadow circuit function unit 38 may perform such circuit functions under aggravated conditions (56). Again, aggravated conditions may comprise an increased clock signal (C+) (e.g., an increased clock speed or increased clock frequency) relative to a normal clock signal (C), a reduced power supply level (P−) relative to a normal power supply level (P), or a combination of an increased clock signal (C+) and a reduced power supply level (P−). Clock unit 32 and/or power supply unit 34 may be configured to deliver such inputs to shadow circuit function unit 38.

Compare unit 39 may be configured to predict a potential future problem with a circuit function performed by circuit function unit 36 under the normal conditions based on comparing output of circuit function unit 36 under the normal conditions to output of shadow circuit function unit 38 under aggravated conditions. In particular, as shown in FIG. 5, compare unit 39 is configured to compare output of circuit function unit 36 under the normal conditions to output of shadow circuit function unit 38 under aggravated conditions (57). Based on the comparison (no branch of 58), compare unit 39 may be configured to output a predictive fault (59) to an external processor, microcontroller, or other system level device, based on predicting the potential future problem of circuit function unit 36. The fault may be predictive insofar as no problems may exist with circuit function unit 36 operating in the normal conditions. Rather, when problems manifest with shadow circuit function unit 38 under the aggravated conditions relative to circuit function unit 36 under normal conditions, this may be a harbinger of future problems manifesting in circuit function unit 36 under the normal conditions. Therefore, upon identifying one or more problems or differences with shadow circuit function unit 38 under the aggravated conditions relative to circuit function unit 36 under the normal conditions, this can be used to trigger maintenance for circuit 30 before problems manifest in circuit function unit 36 under normal conditions.

In addition to providing actual fault monitoring of circuit 30 according to steps 53-55 of FIG. 5, the act of delivering normal power supply and normal clock speed to shadow circuit function unit 38 during normal operation may also improve the safety check operation of steps 57-59 of FIG. 5 (under aggravated conditions) because the act of delivering normal power supply and normal clock speed to shadow circuit function unit 38 during normal operation may cause shadow circuit function unit 38 to degrade similarly over time to circuit function unit 36. In this case, the comparisons between circuit function unit 36 under normal operating conditions and shadow circuit function unit 38 under aggravated operating conditions may be more meaningful than a situation where shadow circuit function unit 38 only operates during a predictive safety check operation.

The following clauses may demonstrate one or more aspects of this disclosure.

Clause 1—A circuit comprising: a circuit function unit configured to perform a circuit function; one or more input units configured to provide one or more inputs to the circuit function unit; and a monitor unit configured to monitor the circuit function unit, wherein the one or more input units are configured to provide a first input to the circuit function unit during a normal operation and to provide a second input that is different than the first input during a predictive safety check operation, and wherein the monitor unit is configured to monitor the circuit function unit during the predictive safety check operation and output a predictive fault signal for the circuit in response to the predictive safety check operation identifying a problem with the circuit function unit during the predictive safety check operation.

Clause 2—The circuit of clause 1, wherein the one or more input units comprise a power supply unit and wherein the first input comprises a normal power supply level and the second input comprises a reduced power supply level.

Clause 3—The circuit of clause 1 or 2, wherein the one or more input units comprise a clock unit and wherein the first input comprises a normal clock speed and the second input comprises an increased clock speed.

Clause 4—The circuit of any of clauses 1-3, wherein the one or more input units comprise a power supply unit and a clock unit, wherein the first input comprises a normal power supply level and a normal clock speed, and wherein the second input comprises a reduced power supply level and an increased clock speed.

Clause 5—The circuit of any of clauses 1-4, wherein the circuit function unit comprises one or more circuit units selected from a group consisting of: a driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Clause 6—The circuit of any of clauses 1-5, wherein the circuit is configured to perform the predictive safety check operation during a start-up process.

Clause 7—The circuit of any of clauses 1-6, wherein the circuit is configured to perform the predictive safety check operation periodically during the normal operation of the circuit.

Clause 8—A circuit comprising: a circuit function unit configured to perform a circuit function under normal conditions; a shadow circuit function unit configured to perform the circuit function under the normal conditions in a first period of time and under aggravated circuit conditions in a second period of time; and a compare unit configured to compare output of the circuit function unit under the normal conditions to output of the shadow circuit function unit under the aggravated circuit conditions and output a predictive fault signal for the circuit in response to the comparison identifying a problem with the shadow circuit function unit performing the circuit function under the aggravated circuit conditions.

Clause 9—The circuit of clause 8, wherein the normal circuit conditions comprise receiving a normal power supply level and the aggravated circuit conditions comprise receiving a reduced power supply level.

Clause 10—The circuit of clause 8 or 9, wherein the normal circuit conditions comprise receiving a normal clock signal and the aggravated circuit conditions comprise receiving an increased clock signal.

Clause 11—The circuit of any of clause 8-10, wherein the normal circuit conditions comprise receiving a normal power supply level and a normal clock signal, and wherein the aggravated circuit conditions comprise receiving a reduced power supply level and an increased clock signal.

Clause 12—The circuit of any of clauses 8-11, wherein the circuit function unit comprises one or more circuit units selected from a group consisting of: a driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Clause 13—The circuit of any of clauses 8-12, wherein the compare unit is configured to compare output of the circuit function unit under the normal conditions to output of the shadow circuit function unit under the aggravated circuit conditions periodically during operation of the circuit.

Clause 14—The circuit of any of clauses 8-13, wherein the compare unit is further configured to: compare output of the circuit function unit under the normal conditions to output of the shadow circuit function unit under the normal conditions; and output an actual fault signal for the circuit in response to the comparison of output of the circuit function unit under the normal conditions to output of the shadow circuit function unit under the normal conditions identifying a circuit problem.

Clause 15—A method of operating a circuit, the method comprising: performing a circuit function under normal conditions; performing the circuit function under aggravated conditions; predicting a potential future problem with the circuit function under the normal conditions based on an output of the circuit function under the aggravated conditions; and outputting a predictive fault based on predicting the potential future problem.

Clause 16—The method of clause 15, wherein performing the circuit function under the normal conditions comprises receiving a normal power supply level and performing the circuit function under the aggravated conditions comprises receiving a reduced power supply level.

Clause 17—The method of clause 15 or 16, wherein performing the circuit function under the normal conditions comprises receiving a normal clock signal and performing the circuit function under the aggravated conditions comprises receiving an increased clock signal.

Clause 18—The method of any of clauses 15-17, wherein performing the circuit function under the normal conditions comprises receiving a normal power supply level and a normal clock speed, and wherein performing the circuit function under the aggravated conditions comprises receiving a reduced power supply level and an increased clock signal.

Clause 19—The method of any of clauses 15-18, further comprising: performing the circuit function via a circuit function unit under the normal conditions; performing the circuit function via the circuit function unit under the aggravated conditions; and checking the circuit function under the aggravated conditions via a safety monitor unit.

Clause 20—The method of any of clauses 15-18, further comprising: performing the circuit function via a circuit function unit under the normal conditions; performing the circuit function via a shadow circuit function unit under the normal conditions; performing the circuit function via the shadow circuit function unit under the aggravated conditions; and comparing outputs of the circuit function unit under the normal conditions and the shadow circuit function unit under the aggravated conditions, wherein outputting the predictive alert based on predicting the potential future problem comprises outputting the predictive alert based on comparing the outputs of the circuit function unit under the normal conditions and the shadow circuit function unit under the aggravated conditions.

Clause 21—The method of claim 20, further comprising: comparing outputs of the circuit function unit under the normal conditions and the shadow circuit function unit under the normal conditions; identifying an actual problem with the circuit based on comparing the outputs of the circuit function unit under the normal conditions and the shadow circuit function unit under the normal conditions; and outputting an actual alert for the circuit in response to identifying the actual problem.

Clause 22—The method of any of clauses 15-21, wherein the circuit functions comprise one or more functions associated with one or more circuit units selected from a group consisting of: a driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Various examples of the disclosure have been described. Any combination of the described systems, operations, or functions is contemplated. These and other examples are within the scope of the following claims.

What is claimed is:

1. A circuit comprising:
    a circuit function unit configured to perform a circuit function, wherein the circuit function unit comprises one or more circuit units selected from a group consisting of: a driver circuit a logic circuit; a motor driver; an oscillator circuit; a level shifter circuit; a phase shift circuit; a phase locked loop circuit; an analog-to-digital converter circuit; a digital-to-analog converter circuit; an arithmetic logic unit (ALU); a processor; a microcontroller; a digital signal processor (DSP); a communication interface circuit; a digital logic circuit; a state machine; a signal processing circuit; a control circuit; an analog function circuit; a sensor; and a memory circuit;
    one or more input units configured to provide one or more inputs to the circuit function unit, wherein the one or more input units comprise one or more circuit units selected from a group consisting of a clock circuit and a power supply circuit; and
    a monitor circuit configured to monitor the circuit function unit,
    wherein the one or more input units are configured to provide a first input to the circuit function unit during a normal operation and to provide a second input that is different than the first input during a predictive safety check operation, and
    wherein the monitor circuit is configured to monitor the circuit function unit during the predictive safety check operation and output a predictive fault signal for the circuit in response to the predictive safety check operation identifying a problem with the circuit function unit during the predictive safety check operation.

2. The circuit of claim 1, wherein the one or more input units comprise a power supply unit and wherein the first input comprises a normal power supply level and the second input comprises a reduced power supply level.

3. The circuit of claim 1, wherein the one or more input units comprise a clock unit and wherein the first input comprises a normal clock speed and the second input comprises an increased clock speed.

4. The circuit of claim 1, wherein the one or more input units comprise a power supply unit and a clock unit, wherein the first input comprises a normal power supply level and a normal clock speed, and wherein the second input comprises a reduced power supply level and an increased clock speed.

5. The circuit of claim 1, wherein the circuit is configured to perform the predictive safety check operation during a start-up process.

6. The circuit of claim 1, wherein the circuit is configured to perform the predictive safety check operation periodically during the normal operation of the circuit.

7. A circuit comprising:
    a circuit function unit configured to perform a circuit function under normal conditions, wherein the circuit function unit comprises one or more circuit units selected from a group consisting of: a first driver circuit; a first logic circuit; a first motor driver; a first oscillator circuit; a first level shifter circuit; a first phase shift circuit; a first phase locked loop circuit; a first analog-to-digital converter circuit; a first digital-to-analog converter circuit; a first arithmetic logic unit (ALU); a first processor; a first microcontroller; a first digital signal processor (DSP); a first communication interface circuit; a first digital logic circuit; a first state machine; a first signal processing circuit; a first control circuit; a first analog function circuit; a first sensor; and a first memory circuit;
    a shadow circuit function unit configured to perform the circuit function under the normal conditions in a first period of time and under aggravated circuit conditions in a second period of time, wherein the shadow circuit function unit comprises one or more circuit units selected from a group consisting of: a second driver circuit; a second logic circuit; a second motor driver; a second oscillator circuit; a second level shifter circuit; a second phase shift circuit; a second phase locked loop circuit; a second analog-to-digital converter circuit; a second digital-to-analog converter circuit; a second ALU, a second processor; a second microcontroller; a second DSP; a second communication interface circuit; a second digital logic circuit; a second state machine; a second signal processing circuit; a second control circuit; a second analog function circuit; a second sensor; and a second memory circuit; and
    a compare circuit comprising one or more comparators configured to compare output of the circuit function unit under the normal conditions to output of the shadow circuit function unit under the aggravated circuit conditions, wherein the compare circuit is configured to output a predictive fault signal for the circuit in response to the comparison identifying a problem with the shadow circuit function unit performing the circuit function under the aggravated circuit conditions.

8. The circuit of claim 7, wherein the normal circuit conditions comprise receiving a normal power supply level and the aggravated circuit conditions comprise receiving a reduced power supply level.

9. The circuit of claim 7, wherein the normal circuit conditions comprise receiving a normal clock signal and the aggravated circuit conditions comprise receiving an increased clock signal.

10. The circuit of claim 7, wherein the normal circuit conditions comprise receiving a normal power supply level and a normal clock signal, and wherein the aggravated circuit conditions comprise receiving a reduced power supply level and an increased clock signal.

11. The circuit of claim 7, wherein the compare circuit is configured to compare output of the circuit function unit under the normal conditions to output of the shadow circuit function unit under the aggravated circuit conditions periodically during operation of the circuit.

12. The circuit of claim 7, wherein the compare circuit is further configured to:
- compare output of the circuit function unit under the normal conditions to output of the shadow circuit function unit under the normal conditions; and
- output an actual fault signal for the circuit in response to the comparison of output of the circuit function unit under the normal conditions to output of the shadow circuit function unit under the normal conditions identifying a circuit problem.

13. A method of operating a circuit, the method comprising:
- performing a circuit function under normal conditions;
- performing the circuit function under aggravated conditions;
- predicting a potential future problem with the circuit function under the normal conditions based on an output of the circuit function under the aggravated conditions; and
- outputting a predictive fault based on predicting the potential future problem.

14. The method of claim 13, wherein performing the circuit function under the normal conditions comprises receiving a normal power supply level and performing the circuit function under the aggravated conditions comprises receiving a reduced power supply level.

15. The method of claim 13, wherein performing the circuit function under the normal conditions comprises receiving a normal clock signal and performing the circuit function under the aggravated conditions comprises receiving an increased clock signal.

16. The method of claim 13, wherein performing the circuit function under the normal conditions comprises receiving a normal power supply level and a normal clock speed, and wherein performing the circuit function under the aggravated conditions comprises receiving a reduced power supply level and an increased clock signal.

17. The method of claim 13, further comprising:
- performing the circuit function via a circuit function unit under the normal conditions;
- performing the circuit function via the circuit function unit under the aggravated conditions; and
- checking the circuit function under the aggravated conditions via a safety monitor unit.

18. The method of claim 13, further comprising:
- performing the circuit function via a circuit function unit under the normal conditions;
- performing the circuit function via a shadow circuit function unit under the normal conditions;
- performing the circuit function via the shadow circuit function unit under the aggravated conditions; and
- comparing outputs of the circuit function unit under the normal conditions and the shadow circuit function unit under the aggravated conditions,
- wherein outputting the predictive alert based on predicting the potential future problem comprises outputting the predictive alert based on comparing the outputs of the circuit function unit under the normal conditions and the shadow circuit function unit under the aggravated conditions.

19. The method of claim 18, further comprising:
- comparing outputs of the circuit function unit under the normal conditions and the shadow circuit function unit under the normal conditions;
- identifying an actual problem with the circuit based on comparing the outputs of the circuit function unit under the normal conditions and the shadow circuit function unit under the normal conditions; and
- outputting an actual alert for the circuit in response to identifying the actual problem.

20. The method of claim 13, wherein the circuit functions comprise one or more functions associated with one or more circuit units selected from a group consisting of:
- a driver circuit;
- a logic circuit;
- a motor driver;
- an oscillator circuit;
- a level shifter circuit;
- a phase shift circuit;
- a phase locked loop circuit;
- an analog-to-digital converter circuit;
- a digital-to-analog converter circuit;
- an arithmetic logic unit (ALU);
- a processor;
- a microcontroller;
- a digital signal processor (DSP);
- a communication interface circuit;
- a digital logic circuit;
- a state machine;
- a signal processing circuit;
- a control circuit;
- analog function circuit;
- a sensor; or
- a memory circuit.

21. A circuit, wherein the circuit is configured to:
- perform a circuit function under normal conditions;
- perform the circuit function under aggravated conditions;
- predict a potential future problem with the circuit function under the normal conditions based on an output of the circuit function under the aggravated conditions; and
- output a predictive fault based on predicting the potential future problem.

22. The circuit of claim 21, wherein the circuit function comprises one or more functions associated with one or more circuit units selected from a group consisting of:
- a driver circuit;
- a logic circuit;
- a motor driver;
- an oscillator circuit;
- a level shifter circuit;
- a phase shift circuit;
- a phase locked loop circuit;
- an analog-to-digital converter circuit;
- a digital-to-analog converter circuit;
- an arithmetic logic unit (ALU);
- a processor;
- a microcontroller;
- a digital signal processor (DSP);
- a communication interface circuit;
- a digital logic circuit;
- a state machine;
- a signal processing circuit;
- a control circuit;
- analog function circuit;
- a sensor; or
- a memory circuit, and wherein the normal conditions and the aggravated conditions are defined by one or more input units comprise one or more circuit units selected from a group consisting of a clock circuit and a power supply circuit.

* * * * *